United States Patent
Cho et al.

(10) Patent No.: US 10,651,316 B2
(45) Date of Patent: May 12, 2020

(54) SYNAPTIC SEMICONDUCTOR DEVICE AND NEURAL NETWORKS USING THE SAME

(71) Applicant: Gachon University of Industry-Academic cooperation Foundation, Seongnam-si, Gyeonggi-do (KR)

(72) Inventors: Seongjae Cho, Seoul (KR); Yongbeom Cho, Seoul (KR)

(73) Assignee: GACHON UNIVERSITY OF INDUSTRY-ACADEMIC COOPERATION (KR)

( * ) Notice: Subject to any disclaimer, the term of this patent is extended or adjusted under 35 U.S.C. 154(b) by 0 days.

(21) Appl. No.: 15/892,658

(22) Filed: Feb. 9, 2018

(65) Prior Publication Data

US 2019/0148560 A1 May 16, 2019

(30) Foreign Application Priority Data

Nov. 16, 2017 (KR) ........................ 10-2017-0152803

(51) Int. Cl.
*H01L 29/788* (2006.01)
*H01L 29/423* (2006.01)
*H01L 27/11521* (2017.01)
*H01L 23/528* (2006.01)
*H01L 29/04* (2006.01)
*G06N 3/04* (2006.01)
*H01L 29/165* (2006.01)

(52) U.S. Cl.
CPC ....... *H01L 29/7883* (2013.01); *G06N 3/0454* (2013.01); *H01L 23/5286* (2013.01); *H01L 27/11521* (2013.01); *H01L 29/04* (2013.01); *H01L 29/42324* (2013.01); *H01L 29/42328* (2013.01); *H01L 29/7889* (2013.01); *H01L 29/165* (2013.01)

(58) Field of Classification Search
CPC .......... H01L 29/7883; H01L 29/42328; H01L 29/42324; H01L 27/11521; H01L 23/5286; H01L 29/7889; H01L 29/04; H01L 29/165; H01L 29/788; H01L 27/11517; G06N 3/0454; G06N 3/088; G06N 3/0635; G06N 3/049; G06N 3/063
See application file for complete search history.

(56) References Cited

U.S. PATENT DOCUMENTS

| | | | |
|---|---|---|---|
| 6,376,312 B1 * | 4/2002 | Yu | H01L 21/84 257/220 |
| 9,508,811 B2 * | 11/2016 | Wang | H01L 29/42324 |
| 2012/0001252 A1 * | 1/2012 | Alsmeier | H01L 27/11551 257/321 |
| 2012/0084241 A1 | 4/2012 | Friedman et al. | |
| 2015/0303207 A1 * | 10/2015 | Liu | H01L 29/42336 257/316 |

FOREIGN PATENT DOCUMENTS

KR 10-1425857 7/2014

* cited by examiner

*Primary Examiner* — Benjamin Tzu-Hung Liu
(74) *Attorney, Agent, or Firm* — Gerald E. Hespos; Michael J. Porco; Matthew T. Hespos

(57) ABSTRACT

A synaptic semiconductor device and neural networks using the same operates with an ultrahigh speed through a tunneling operation by a semi-floating gate and applies pre- and post-synaptic signals to first and second control gates directly.

9 Claims, 4 Drawing Sheets

SYNAPTIC SEMICONDUCTOR DEVICE AND NEURAL NETWORKS USING THE SAME

CROSS-REFERENCE TO RELATED APPLICATION

This application claims priority to Korean Patent Application No. 10-2017-0152803, filed on Nov. 16, 2017, under 35 U.S.C. 119, the entire contents of which are hereby incorporated by reference.

BACKGROUND

Field of the Invention

The present invention relates to artificial neural networks for implementing an artificial intelligence system, and more particularly to a synaptic semiconductor device and neural networks using the same.

Description of the Related Art

Recently, many researches on synaptic devices based on semiconductor memory devices have been made to implement a hardware-driven artificial intelligence system.

In order to implement the artificial intelligence system, it is essential to develop arrays that can simulate the connections between numerous neurons as well as the development of synaptic devices. In particular, since human neurons are about 100 billion and connect to 1,000 synapses per neuron, an array of about 100 trillion neuron devices must be constructed to implement an artificial intelligence system that replaces the human brain.

To imitate such a large number of synapses, up to now, proposals have been made for NAND flash based synaptic devices due to the high scalability of semiconductor memory cells. However, there is a need for improvement in terms of speed.

To meet the need, a synaptic device based on DRAM has been proposed. This is more advantageous for a relatively higher speed operation than the NAND flash based synaptic device. As like as the difficulties in the conventional DRAM technology, it takes disadvantages for improving the integration degree due to the additional capacitor structure.

One of the characteristics of biological synapses is potentiation or depression of synaptic connectivity depending on the difference in a fire time between pre-synaptic neuron and post-synaptic neuron.

US Patent Publication No. 2012/0084241 discloses a synaptic device formed of phase change material for imitating STDP (Spike-Timing-Dependent Plasticity) characteristics, which change the connectivity of synapses connecting two neurons by the fire time difference between the pre- and post-synaptic neurons. However, the short-term memory characteristics of the biological synapse cannot be implemented due to the characteristics of the phase change material. Thus, there is a problem that the short- and long-term memory switching cannot be implemented.

For improving the problem as described above and for mimicking the short- and long-term switching characteristics and causal relation inference characteristics of living body by the time difference between pre- and post-synaptic signals, a synaptic semiconductor device and operation method thereof are disclosed in Korean Patent No. 10-1425857.

Korean Patent No. 10-1425857 has a status of an original patent for a synaptic semiconductor device, but has difficulties in applying the pre-synaptic signal to the synaptic device directly.

SUMMARY

The present invention is proposed to overcome the problems of the prior art. And objective of the present invention is to provide a synaptic semiconductor device and neural networks using the same that operates with an ultrahigh speed through a tunneling operation by a semi-floating gate and that applies a pre-synaptic signal to a control gate directly.

To achieve the objectives, a synaptic semiconductor device according to the present invention comprises a channel/source stack structure vertically arranged in the order of a channel region and a source region from a semiconductor substrate; a floating gate and a control gate spaced apart from a sidewall of the channel/source stack structure interlaying with a gate insulating film on the semiconductor substrate; and a drain region formed in the semiconductor substrate adjacent to the control gate.

Here, the gate insulating film may be also provided between the control gate and the semiconductor substrate, a drain extension having a conductivity type equal to that of the drain region may be formed in the semiconductor substrate from the drain region to a lower portion of the channel/source stack structure, and the floating gate may be formed of a semiconductor material having a conductivity type opposite to that of the drain region and be a semi-floating gate having a protruding portion that contacts the drain extension by a PN junction.

The semiconductor substrate, the channel region and the source region may be formed of crystalline silicon or polycrystalline silicon.

At least one of the drain region and the drain extension may be formed of silicon germanium or germanium.

The control gate may be vertically divided into a first control gate and a second control gate interlaying with the gate insulating film on a sidewall of the floating gate.

The channel/source stack structure may be a columnar structure vertically stacked with the channel region and the source region on the semiconductor substrate, the channel region having a predetermined vertical length, the floating gate may be a cylindrical shape surrounding the sidewall of the columnar channel/source structure interlaying with the gate insulating film, the protruding portion having a circularly protruding portion on a lower portion of the floating gate, the first and the second control gates may be a ring shape respectively surrounding upper and lower portions of the cylindrical sidewall of the floating gate interlaying with the gate insulating film, the drain region may be a ring shape surrounding the first and the second control gates, and the drain extension may fill the interior of the ring shaped drain region in the semiconductor substrate and form a PN junction with the circularly protruding portion of the floating gate.

Neural networks using a plurality of synaptic semiconductor devices according to the present invention has technical features as follows: The plurality of synaptic semiconductor devices may be arranged in one or more layers having an M×N array per layer, first control gates of synaptic semiconductor devices arranged in an i-th row among the plurality of synaptic semiconductor devices arranged in the M×N array may be connected to an i-th pre-synapse neuron signal line arranged in a row direction, second control gates and drain regions of synaptic semiconductor devices arranged in a j-th column among the plurality of synaptic semiconductor devices arranged in the M×N array may be respectively connected to a j-th post-synapse neuron dendrite signal line and a j-th post-synapse neuron axon signal line arranged side by side in a column direction, and source regions of the plurality of synaptic semiconductor devices arranged in the M×N array may be connected to ground or a common ground line.

The present invention can provide a synaptic semiconductor device and neural networks using the same that operates with an ultrahigh speed through a tunneling operation by a semi-floating gate and that applies pre- and post-synaptic signals to first and second control gates directly.

In these drawings, the following reference numbers are used throughout: reference number 10 indicates a source region, 20 a channel region, 30 a semiconductor substrate (a drain extension), 32 a depletion layer (region), 40 a drain region, 50 a gate insulating film, 60 a semi-floating gate, 62 a protruding portion, 70 a control gate, 72 a first control gate and 74 a second control gate.

DETAILED DESCRIPTION

Detailed descriptions of preferred embodiments of the present invention are provided below with accompanying drawings.

Figure 1:
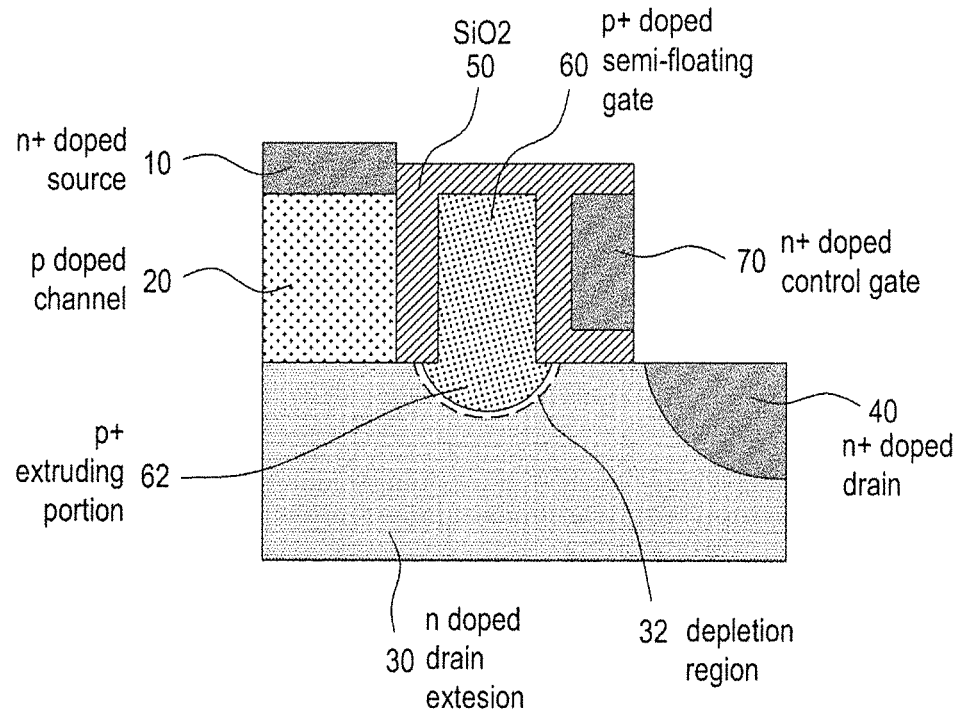
FIGS. 1 and 2 are cross-sectional views of synaptic semiconductor devices according to embodiments of the present invention.

A synaptic semiconductor device according to an embodiment of the present invention comprises, as shown in FIG. 1, a channel/source stack structure vertically arranged in the order of a channel region 20 and a source region 10 from a semiconductor substrate 30; a floating gate 60 and a control gate 70 spaced apart from a sidewall of the channel/source stack structure 10 and 20 interlaying with a gate insulating film 50 on the semiconductor substrate 30; and a drain region 40 formed in the semiconductor substrate 30 adjacent to the control gate 70.

Here, the gate insulating film 50 may be also provided between the control gate 70 and the semiconductor substrate 30, a drain extension having a conductivity type equal to that of the drain region 40 may be formed in the semiconductor substrate 30 from the drain region 40 to a lower portion (i.e., a bottom) of the channel/source stack structure 10 and 20, and the floating gate 60 may be formed of a semiconductor material having a conductivity type opposite to that of the drain region 40 and be a semi-floating gate 60 having a protruding portion 62 that contacts the drain extension 30 by a PN junction.

The semiconductor substrate 30 is shown as a drain extension in FIG. 1. However, it includes the drain extension. The drain region 40 and the protruding portion 62 of the floating gate 60 are inserted in the semiconductor substrate 30 and contact the drain extension.

The semiconductor substrate 30, the channel region 20 and the source region 10 may be formed of crystalline silicon or polycrystalline silicon. In one embodiment, the channel/source stack structure 10 and 20 can be formed of crystalline silicon by etching a crystalline silicon substrate. In another embodiment, it can be made by forming epitaxial layers or by stacking polycrystalline silicon layers on a crystalline silicon substrate 30.

The drain region 40 and the drain extension may be also formed in semiconductor substrate 30 made of crystalline silicon or polycrystalline silicon. Preferably, at least one of the drain region 40 and the drain extension may be formed of a material having a small energy bandgap or a small effective mass of carriers such as silicon germanium (SiGe) or germanium (Ge).

Particularly, it is preferable that the drain extension 30 is formed of a material having a smaller energy bandgap or a smaller effective mass of carriers than that of the floating gate 60. By this configuration, a more effective tunneling from the drain extension 30 toward the floating gate 60 can occur in a depletion region 32 induced by a PN junction between the protruding portion 62 of the floating gate 60 and the drain extension 30.

When the floating gate 60 is made of silicon (Si) doped with p-type impurities, the drain extension 30 can be formed of silicon germanium (SiGe) or germanium (Ge) doped with n-type impurities.

The drain extension 30 may be formed of a material having a conductivity type (for example, n-type) equal to the conductivity type of the drain region 40, but the impurity concentration of the former is lower than that of the latter. And the floating gate 60 includes the protruding portion 62 may be formed of a material having a conductivity type opposite to that of the drain extension 30. It is preferable that the impurity concentration of the floating gate 60 is higher than the drain extension 30. By this configuration, the depletion region 32 can be formed more toward the drain extension 30.

The control gate 70, as shown in FIG. 1, may be formed of a semiconductor material doped with p-type impurities, but may be formed of a conductive material such as an n-type doped semiconductor material, other metal, etc.

The gate insulating film 50, as shown in FIG. 1, may be interposed between the channel/source stack structure 10 and 20 and the floating gate 60, between the floating gate 60 and the control gate 70 and between the control gate 70 and the drain extension 30, and can be formed of silicon oxide ($SiO_2$) or a high dielectric material having a dielectric constant higher than silicon oxide ($SiO_2$).

The protruding portion 62 of the floating gate 60, as shown in FIG. 1, has a shape extending into the drain extension 30, but is formed so as not to contact the channel region 20.

FIG. 1 shows a synaptic semiconductor device having an n-type channel formed in the p-type channel region 20. However, it is possible to implement a synaptic semiconductor device having an p-type channel by forming the source region 10, the drain extension 30 and the drain region 40 with p-type and the channel region 20, the floating gate 60 and the protruding portion 62 with n-type, i.e., by forming the regions 10, 20, 30, 40, 60 and 62 to have conductivity types opposite to those shown in FIG. 1.

Common features of the embodiments described above are that the channel/source stack structure 10 and 20, the floating gate 60 and the control gate 70 are formed side by side by interlaying the gate insulating film 50 on the drain extension 30 and the floating gate 60 serves as a semi-floating gate for inducing the carrier tunneling by insulating between the drain extension 30 and the protruding portion 62 formed at the lower part of the floating gate 60 with the depletion layer 32 of the PN junction without intervention of an insulating film.

Figure 4:
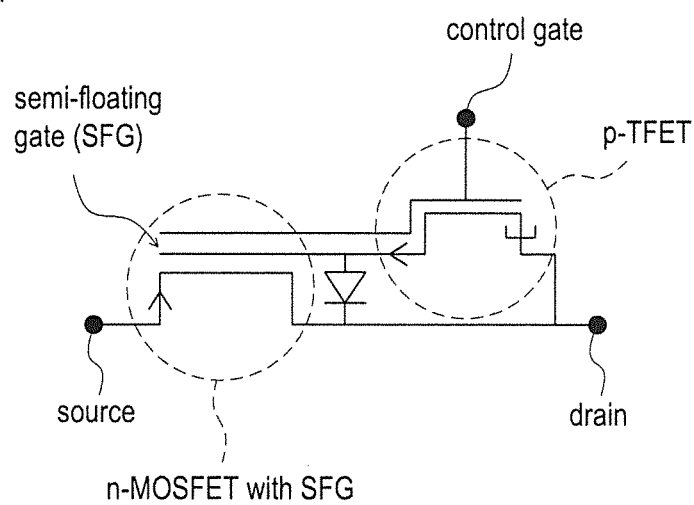
FIG. 4 is a circuit symbol representing a synaptic semiconductor device of FIG. 1.

Therefore, each of embodiments can be represented by a symbol shown in FIG. 4 because it has a structure that is combined with a device having semi-floating gate (SFG) and an embedded tunneling field effect transistor (TFET).

Figure 2:
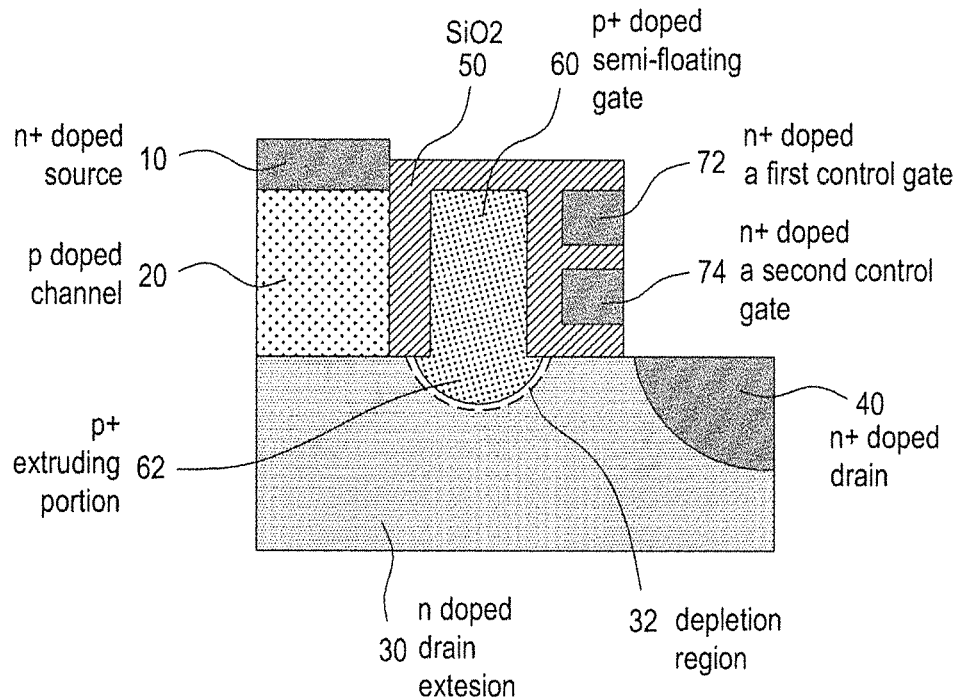

A synaptic semiconductor device according to another embodiment of the present invention, as shown in FIG. 2, has a structural feature: In the above-described embodiment, the control gate 70 may be vertically divided into a first control gate 72 and a second control gate 74 interlaying the gate insulating film 50 on a sidewall of the floating gate 60.

Other configurations shown in FIG. 2 are the same as those described in the embodiment of FIG. 1.

The synaptic semiconductor device according to the embodiment of FIG. 2 has the advantages of the embodiment of FIG. 1. In addition, it has an advantage that the pre- and post-synaptic signals can be applied directly to a synaptic device vertically divided into the first and second control gates 72 and 74 on the sidewall of the floating gate 60.

Figure 7:
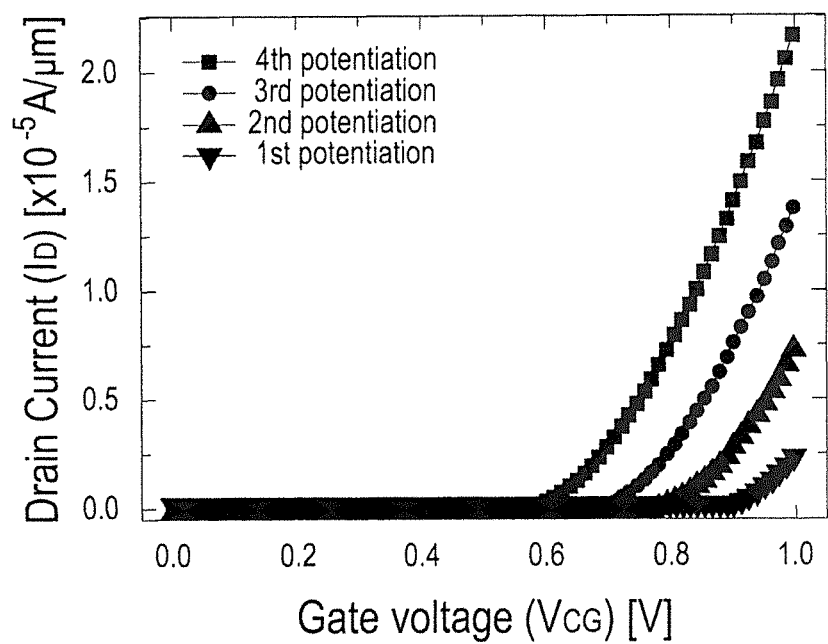
FIG. 7 shows an I-V electrical characteristic view when a short-width pulse having a negative bias is applied to a second control gate 1 to 4 times in a condition that a negative bias is applied to a first control gate of the embodiment of FIG. 2.

FIG. 7 shows an I-V electrical characteristic view when a short-width pulse having a negative bias is applied to a second control gate 74 1 to 4 times in a condition that a negative bias is applied to a first control gate 72 of the embodiment of FIG. 2.

Referring to FIG. 7, as the synaptic connectivity is potentiated, more carriers are moved into the semi-floating gate (SFG) 60 through the depletion layer 32 by tunneling and stored in it. As the result, the threshold voltage is shifted to the left.

The synaptic semiconductor device according to the embodiment of FIG. 2 can be implemented as a planar type. However, as shown in FIG. 3, the synaptic semiconductor device may have a 3-dimentional symmetric structure formed by rotating a z-axis that is a vertical axis passing through the channel/source stack structure 10 and 20 on the x-y plane of the semiconductor substrate 30 having the drain extension.

In the embodiment of FIG. 2, the synaptic semiconductor device having 3-dimentional symmetric structure rotated in FIG. 3 may have technical features as follows: The channel/source stack structure 10 and 20 may be a columnar structure vertically stacked with the channel region 20 and the source region 10 on the semiconductor substrate 30, the channel region 20 having a predetermined vertical length. The floating gate 60 may be a cylindrical shape surrounding the sidewall of the columnar channel/source structure interlaying with the gate insulating film 50, the protruding portion 62 having a circularly protruding portion on a lower portion of the floating gate 60. The first and the second control gates 72 and 74 may be a ring shape respectively surrounding upper and lower portions of the cylindrical sidewall of the floating gate 60 interlaying with the gate insulating film 50. The drain region 40 may be a ring shape surrounding the first and the second control gates 72 and 74. And the drain extension 30 may fill the interior of the ring shaped drain region 40 in the semiconductor substrate 30 and form a PN junction with the circularly protruding portion 62 of the floating gate 60.

Figure 3:
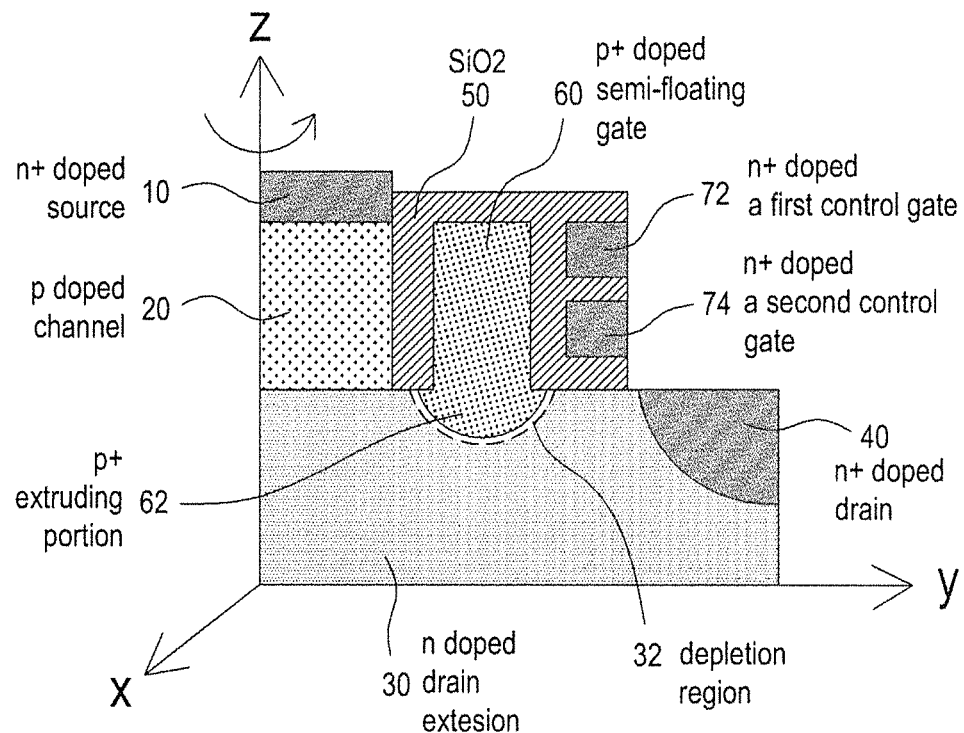
FIG. 3 is a sectional view of a quadrant of synaptic semiconductor device according to another embodiment with a structure that is obtained by rotating the section of FIG. 2 about z axis.
Figure 5:
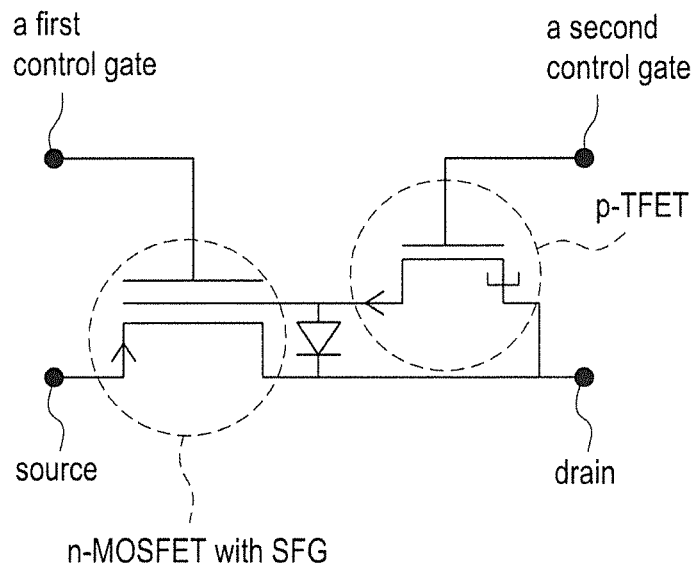
FIG. 5 is a circuit symbol representing a synaptic semiconductor device of FIG. 2.

The synaptic semiconductor devices according to the embodiments of FIGS. 2 and 3 can be represented by a symbol shown in FIG. 5 because they have a structure that is combined with an n-channel MOSFET device having semi-floating gate (n-MOSFET with SFG) controlled by the first control gate 72 and a p-channel tunneling field effect transistor (p-TFET).

Figure 6:
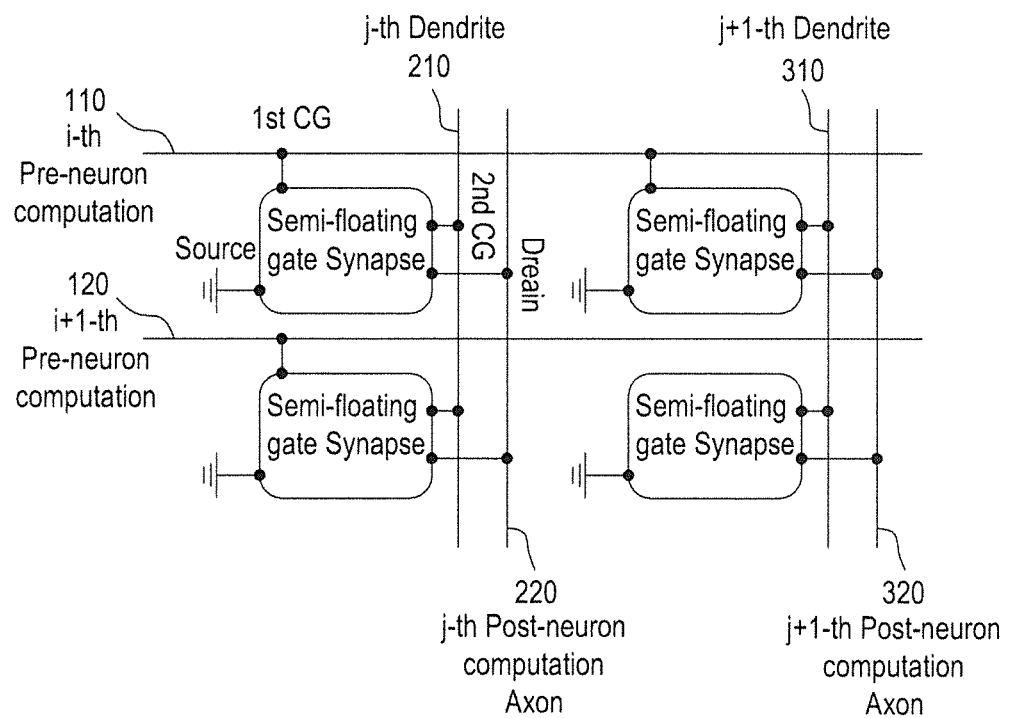
FIG. 6 is a structural view of neural networks using a synaptic semiconductor device according to an embodiment of the present invention.

The neural networks according to an embodiment of the present invention, as shown in FIG. 6, may be implemented by using a plurality of synaptic semiconductor devices according to each of the embodiments of FIGS. 2 and 3.

Here, the plurality of synaptic semiconductor devices may be arranged in one or more layers having an M×N matrix array per layer. That is, the semiconductor substrate 30 may be stacked to one or more layers interlaying with an interlayer insulating film. The plurality of synaptic semiconductor devices may be arranged in the M×N matrix array for each layer. When the semiconductor substrate 30 is stacked to two or more layers, it is preferably formed of polycrystalline silicon layers or polycrystalline germanium layers.

As shown in FIG. 6, first control gates 72 (1st CG) of synaptic semiconductor devices arranged in an i-th row among the plurality of synaptic semiconductor devices arranged in the M×N array may be connected to an i-th pre-synapse neuron signal line 110 arranged in a row direction. Second control gates 74 (2nd CG) and drain regions 40 of synaptic semiconductor devices arranged in a j-th column among the plurality of synaptic semiconductor devices arranged in the M×N array may be respectively connected to a j-th post-synapse neuron dendrite signal line 210 and a j-th post-synapse neuron axon signal line 220 arranged side by side in a column direction.

An i+1-th pre-synapse neuron signal line 120, j+1-th post-synapse neuron dendrite signal line 310, a j+1-th post-synapse neuron axon signal line 320, etc. may be connected in the same manner.

And source regions 10 of the plurality of synaptic semiconductor devices arranged in the M×N array may be connected to ground or a common ground line (not shown).

By the first and second control gates 72 and 74 of the plurality of synaptic semiconductor devices arranged in the M×N array for each layer in the above-described neural networks, the pre- and post-synapse signals can be directly applied to each of the synaptic devices. By this configuration, it is possible to effectively imitate STDP characteristics in which the synaptic connectivity is changed by the fire time difference between the pre- and post-synaptic neurons.

This work was supported by Nano•Material Technology Development Program through the National Research Foundation of Korea (NRF) funded by the Ministry of Science, ICT & Future Planning (MSIP) (2016M3A7B4910348).

What is claimed is:

1. A synaptic semiconductor device comprising:
   a channel/source stack structure vertically arranged in the order of a channel region and a source region from a semiconductor substrate;
   a floating gate and a control gate spaced apart from a sidewall of the channel/source stack structure interlaying with a gate insulating film on the semiconductor substrate; and
   a drain region formed in the semiconductor substrate adjacent to the control gate, wherein:

the gate insulating film is also provided between the control gate and the semiconductor substrate, a drain extension having a conductivity type equal to that of the drain region is formed in the semiconductor substrate from the drain region to a lower portion of the channel/source stack structure, the floating gate is formed of a semiconductor material having a conductivity type opposite to that of the drain region and is a semi-floating gate having a protruding portion that contacts the drain extension by a PN junction, the control gate is vertically divided into a first control gate and a second control gate interlaying with the gate insulating film on a sidewall of the floating gate, and the synaptic semiconductor device has a structure combined with an n-channel MOSFET device having the semi-floating gate (n-MOSFET with SFG) controlled by the first control gate and a p-channel tunneling field effect transistor (p-TFET) controlled by the second control gate.

2. The synaptic semiconductor device of claim 1, wherein the semiconductor substrate, the channel region and the source region are formed of crystalline silicon or polycrystalline silicon.

3. The synaptic semiconductor device of claim 1, wherein at least one of the drain region and the drain extension is formed of silicon germanium or germanium.

4. Neural networks using a plurality of synaptic semiconductor devices of claim 1, wherein:

the plurality of synaptic semiconductor devices are arranged in one or more layers having an M×N array per layer, first control gates of synaptic semiconductor devices arranged in an i-th row among the plurality of synaptic semiconductor devices arranged in the M×N array are connected to an i-th pre-synapse neuron signal line arranged in a row direction, second control gates and drain regions of synaptic semiconductor devices arranged in a j-th column among the plurality of synaptic semiconductor devices arranged in the M×N array are respectively connected to a j-th post-synapse neuron dendrite signal line and a j-th post-synapse neuron axon signal line arranged side by side in a column direction, and source regions of the plurality of synaptic semiconductor devices arranged in the M×N array are connected to ground or a common ground line.

5. A synaptic semiconductor device, comprising:

a channel/source stack structure vertically arranged in the order of a channel region and a source region from a semiconductor substrate;

a floating gate and a control gate spaced apart from a sidewall of the channel/source stack structure interlaying with a gate insulating film on the semiconductor substrate; and a drain region formed in the semiconductor substrate adjacent to the control pate, wherein:

the gate insulating film is also provided between the control gate and the semiconductor substrate, a drain extension having a conductivity type equal to that of the drain region is formed in the semiconductor substrate from the drain region to a lower portion of the channel/source stack structure, the floating gate is formed of a semiconductor material having a conductivity type opposite to that of the drain region and is a semi-floating gate having a protruding portion that contacts the drain extension by a PN junction, the channel/source stack structure is a columnar structure vertically stacked with the channel region and the source region on the semiconductor substrate, the channel region having a predetermined vertical length, the floating gate is a cylindrical shape surrounding the sidewall of the columnar channel/source structure interlaying with the gate insulating film, the protruding portion having a circularly protruding portion on a lower portion of the floating gate, the first and the second control gates are a ring shape respectively surrounding upper and lower portions of the cylindrical sidewall of the floating gate interlaying with the gate insulating film, the drain region is a ring shape surrounding the first and the second control gates, and the drain extension fills the interior of the ring shaped drain region in the semiconductor substrate and forms a PN junction with the circularly protruding portion of the floating gate.

6. A synaptic semiconductor device, comprising:

a channel/source stack structure vertically arranged in the order of a channel region and a source region from a semiconductor substrate;

a floating gate and a control gate spaced apart from a sidewall of the channel/source stack structure interlaying with a gate insulating film on the semiconductor substrate; and a drain region formed in the semiconductor substrate adjacent to the control gate, wherein:

the gate insulating film is also provided between the control gate and the semiconductor substrate, a drain extension having a conductivity type equal to that of the drain region is formed in the semiconductor substrate from the drain region to a lower portion of the channel/source stack structure, the floating gate is formed of a semiconductor material having a conductivity type opposite to that of the drain region and is a semi-floating gate having a protruding portion that contacts the drain extension by a PN junction, the semiconductor substrate, the channel region and the source region are formed of crystalline silicon or polycrystalline silicon, the control gate is vertically divided into a first control gate and a second control gate interlaying with the gate insulating film on a sidewall of the floating gate, the channel/source stack structure is a columnar structure vertically stacked with the channel region and the source region on the semiconductor substrate, the channel region having a predetermined vertical length, the floating gate is a cylindrical shape surrounding the sidewall of the columnar channel/source structure interlaying with the gate insulating film, the protruding portion having a circularly protruding portion on a lower portion of the floating gate, the first and the second control gates are a ring shape respectively surrounding upper and lower portions of the cylindrical sidewall of the floating gate interlaying with the gate insulating film, the drain region is a ring shape surrounding the first and the second control gates, and the drain extension fills the interior of the ring shaped drain region in the semiconductor substrate and forms a PN junction with the circularly protruding portion of the floating gate.

7. Neural networks using a plurality of synaptic semiconductor devices of claim 6, wherein:
the synaptic semiconductor devices are arranged in one or more layers having an M×N array per layer,
first control gates of synaptic semiconductor devices arranged in an i-th row among the plurality of synaptic semiconductor devices arranged in the M×N array are connected to an i-th pre-synapse neuron signal line arranged in a row direction,
second control gates and drain regions of synaptic semiconductor devices arranged in a j-th column among the plurality of synaptic semiconductor devices arranged in the M×N array are respectively connected to a j-th post-synapse neuron dendrite signal line and a j-th post-synapse neuron axon signal line arranged side by side in a column direction, and
source regions of the plurality of synaptic semiconductor devices arranged in the M×N array are connected to ground or a common ground line.

8. A synaptic semiconductor device, comprising:
a channel/source stack structure vertically arranged in the order of a channel region and a source region from a semiconductor substrate;
a floating gate and a control gate spaced apart from a sidewall of the channel/source stack structure interlaying with a gate insulating film on the semiconductor substrate; and
a drain region formed in the semiconductor substrate adjacent to the control pate, wherein:
the gate insulating film is also provided between the control gate and the semiconductor substrate,
a drain extension having a conductivity type equal to that of the drain region is formed in the semiconductor substrate from the drain region to a lower portion of the channel/source stack structure,
the floating gate is formed of a semiconductor material having a conductivity type opposite to that of the drain region and is a semi-floating gate having a protruding portion that contacts the drain extension by a PN junction,
at least one of the drain region and the drain extension is formed of silicon germanium or germanium,
the control gate is vertically divided into a first control gate and a second control gate interlaying with the gate insulating film on a sidewall of the floating gate,
the channel/source stack structure is a columnar structure vertically stacked with the channel region and the source region on the semiconductor substrate, the channel region having a predetermined vertical length,
the floating gate is a cylindrical shape surrounding the sidewall of the columnar channel/source structure interlaying with the gate insulating film, the protruding portion having a circularly protruding portion on a lower portion of the floating gate,
the first and the second control gates are a ring shape respectively surrounding upper and lower portions of the cylindrical sidewall of the floating gate interlaying with the gate insulating film,
the drain region is a ring shape surrounding the first and the second control gates, and
the drain extension fills the interior of the ring shaped drain region in the semiconductor substrate and forms a PN junction with the circularly protruding portion of the floating gate.

9. Neural networks using a plurality of synaptic semiconductor devices of claim 8, wherein:
the synaptic semiconductor devices are arranged in one or more layers having an M×N array per layer,
first control gates of synaptic semiconductor devices arranged in an i-th row among the plurality of synaptic semiconductor devices arranged in the M×N array are connected to an i-th pre-synapse neuron signal line arranged in a row direction,
second control gates and drain regions of synaptic semiconductor devices arranged in a j-th column among the plurality of synaptic semiconductor devices arranged in the M×N array are respectively connected to a j-th post-synapse neuron dendrite signal line and a j-th post-synapse neuron axon signal line arranged side by side in a column direction, and
source regions of the plurality of synaptic semiconductor devices arranged in the M×N array are connected to ground or a common ground line.

* * * * *